(12) United States Patent
Forbes

(10) Patent No.: US 7,176,719 B2
(45) Date of Patent: Feb. 13, 2007

(54) CAPACITIVELY-COUPLED LEVEL RESTORE CIRCUITS FOR LOW VOLTAGE SWING LOGIC CIRCUITS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 10/931,379

(22) Filed: Aug. 31, 2004

(65) Prior Publication Data

US 2006/0044012 A1    Mar. 2, 2006

(51) Int. Cl.
*H03K 19/094*    (2006.01)
(52) U.S. Cl. .......................................... 326/68; 326/83
(58) Field of Classification Search .................. 326/68, 326/82–83, 86
See application file for complete search history.

(56) References Cited

U.S. PATENT DOCUMENTS

| | | | |
|---|---|---|---|
| 4,985,643 A | 1/1991 | Proebsting | |
| 5,237,533 A | 8/1993 | Papaliolios | |
| 5,828,611 A | 10/1998 | Kaneko et al. | |
| 5,995,163 A | 11/1999 | Fossum | |
| 6,150,851 A | 11/2000 | Ohmi et al. | |
| 6,166,367 A | 12/2000 | Cho | |
| 6,198,677 B1 | 3/2001 | Hsu et al. | |
| 6,222,788 B1 | 4/2001 | Forbes et al. | |
| 6,246,622 B1 | 6/2001 | Sugibayashi | |
| 6,285,613 B1 | 9/2001 | Koya | |
| 6,341,088 B2 | 1/2002 | Sakamoto et al. | |
| 6,380,765 B1 | 4/2002 | Forbes et al. | |
| 6,437,389 B1 | 8/2002 | Forbes et al. | |
| 6,437,604 B1 | 8/2002 | Forbes | |
| 6,437,608 B1 * | 8/2002 | Miyabe et al. | ................. 327/96 |
| 6,462,582 B1 | 10/2002 | Forbes | |
| 6,529,237 B1 * | 3/2003 | Tsay et al. | ................... 348/241 |
| 6,646,474 B2 | 11/2003 | Forbes | |
| 6,696,852 B1 * | 2/2004 | Brunolli | ....................... 326/30 |
| 6,744,082 B1 | 6/2004 | Forbes et al. | |
| 6,803,794 B2 | 10/2004 | Martin et al. | |
| 6,822,919 B2 | 11/2004 | Sahoo | |
| 6,842,377 B2 | 1/2005 | Takano et al. | |
| 6,861,634 B2 | 3/2005 | Rossi | |
| 6,885,396 B1 | 4/2005 | Panicacci et al. | |

(Continued)

OTHER PUBLICATIONS

Bernstein, Kerry, "High-Speed Design Styles Leverage IBM Technology Prowess", *Micro News (IBM MIcroelectronics), Vol. 3, No. 4*, (Aug. 1999).

(Continued)

*Primary Examiner*—James H. Cho
(74) *Attorney, Agent, or Firm*—Schwegman, Lundberg, Woessner & Kluth, P.A.

(57) ABSTRACT

A level restore circuit includes differential sides and a capacitive network having capacitors cross-coupled between the differential sides to provide a capacitively-coupled positive feedback between the differential sides. The level restore circuit further includes a reset network for resetting input and output nodes of one differential side to a first reset voltage and for resetting input and output nodes of the other differential side to a second reset voltage independent from the first reset voltage. The capacitive network reduces the effect of transistor mismatches and offsets in the level restore circuit. The level restore circuit is useful to generate output signals with a full logic levels based on input signals with a relatively low signal swing.

43 Claims, 5 Drawing Sheets

U.S. PATENT DOCUMENTS

| | | |
|---|---|---|
| 6,912,167 B2 | 6/2005 | Tam |
| 6,937,052 B2 | 8/2005 | Tam |
| 2006/0044903 A1 | 3/2006 | Forbes |

OTHER PUBLICATIONS

Cheng, K., et al., "A 1.2V CMOS Multiplier Using Low-Power Current-Sensing Complementary Pass-Transistor Logic", *Proc. Third Int. Conf. on Electrics, Circuits and Systems*, (1996), pp. 1037-1040, no month.

Deleganes, Daniel J., et al., "Low-Voltage-Swing Logic Circuits for a 7GHz×86 Integer Core", *2004 IEEE International Solid-State Circuits Conference*, (2004), 10 pages, no month.

Fuse, Tsuneaki, et al., "A 0.5V 200MHz 1-Stage 32b ALU Using a Body Bias Controlled SOI Pass-Gate Logic", *1997 IEEE International Solid-State Circuits Conference, Digest of Technical Papers*, 286-287 (Feb. 1997).

Glasser, Lance A., et al., *The Design and Analysis of VLSI Circuits*, Addison-Wesley Publishing Company, (1985), 16-21, no month.

Kayed, Somia I., et al., "CMOS Differential Pass-Transistor Logic (CMOS DPTL) Predischarge Buffer Design", *Proceedings of the Thirteenth National Radio Science Conference*, Cairo, Egypt, 527-235 (Mar. 1996).

Oklobdzija, V. G., "Differential and pass-transistor CMOS logic for high performance systems", *Microelectronics Journal*, 29, (1998), 679-688, no month.

Rabaey, Jan M., *Digital Integrated Circuits: A Design Perspective, Section 4.2.3*, Prentice Hall, Upper Saddle River, NJ, (1996), 210-222, no month.

Thompson, S., et al., "A 90 nm technology featuring 50nm strained silicon channel transistors, 7 layers of Cu interconnects, low k ILD, and 1 um2 SRAM cell", International Electron Devices Meeting, 2002. *IEDM '02. Digest.*, (Dec. 2002), 61-64.

Tretz, C., et al., "Performance Comparison of Differential Static CMOS Circuit Topologies in SOI Technology", *Proceedings 1998 IEEE International SOI Conference*, 123-124 (Oct. 1998).

Yamashita, S., et al., "Pass-Transistor/CMOS Collaborated Logic: The Best of Both Worlds", *1997 Symposium on VLSI Circuits Digest of Technical Papers*, (1997), 31-32, no month.

Yano, K., et al., "Top-Down Pass-Transistor Logic Design", *IEEE Journal of Solid-State Circuits*, 31(6), 792-803, (Jun. 1996).

Zimmermann, Reto, "Low-Power Logic Styles: CMOS Versus Pass-Transistor Logic", *IEEE Journal of Solid-State Circuits*, 32(7), (Jul. 1997), 1079-1090.

\* cited by examiner

CAPACITIVELY-COUPLED LEVEL RESTORE CIRCUITS FOR LOW VOLTAGE SWING LOGIC CIRCUITS

FIELD

The present disclosure relates generally to regeneration of signals in semiconductor devices, and more particularly to level restore circuits for low voltage swing logic circuits.

BACKGROUND

Semiconductors devices such as memory devices and processors reside in many computers and electronic products to store and process data.

A typical memory device or processor includes logic circuits to perform logic functions. Some logic circuits give the results of the logic functions in form of resulting signals with a relatively low voltage or low signal swing. In some cases, the resulting signals may have signal levels at inappropriate levels to be considered as full logic levels (logic one and logic zero) useful for further processing. In these cases, level restore circuits are used to restore the resulting signals to the full logic levels. Some level restore circuits have a sense amplifier with sense amplifier input nodes to sense the resulting signals provided by the logic circuits to generate output signals with the full logic levels.

A typical sense amplifier includes transistors. Transistors are susceptible to mismatches due to variations in manufacturing process. Mismatches in the transistors may create an offset voltage between the input nodes of the sense amplifier when the sense amplifier is reset.

The offset voltage may result in invalid logic levels at the output nodes of the typical sense amplifier after the reset. Further, mismatches in the transistors often require the signal swing of the resulting signals at or the input signals at the input nodes of the sense amplifier to be above a specific signal swing. Thus, in cases where the signal swing of the input signals is relatively low, a typical sense amplifier may be unreliable to produce output signals with correct logic levels.

SUMMARY

The present disclosure discloses, among other things, circuits and methods for reducing the effect of mismatches in transistors and offsets in reset voltages of level restore circuits so that the level restore circuits are more reliable in producing output signals with correct logic levels based on input signals with a relatively low signal swing.

One aspect includes a circuit having a first differential side and a second differential side for generating a differential output signal pair based on a differential input signal pair. The circuit also has capacitive network for capacitively coupling the first differential side to the second differential side to provide a capacitively-coupled positive feedback between the first and second differential sides. The circuit further has a reset network for resetting the first and second differential sides to reset voltages independent from each other. The circuit may be used to receive signals with a relatively low signal swing from output nodes of a logic circuit to generate output signals with full logic levels.

Another aspect includes a method of restoring signal levels. The method performs a reset to reset a first differential input node and a first differential output node of a first differential side to a first reset voltage and to rest a second differential input node and a differential output of a second differential side to a second reset voltage independent from the first reset voltage. The first and second differential sides are capacitively-coupled to store an offset voltage generated during the reset. The method also generates a differential output signal pair at the first and second differential output nodes based on a differential input signal pair received at the first and second differential input nodes after the reset.

This summary is an overview of some of the teachings of the present disclosure and not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which are not to be taken in a limiting sense. The scope of the present disclosure is defined by the appended claims and their legal equivalents.

DETAILED DESCRIPTION OF THE EMBODIMENTS

Figure 1:
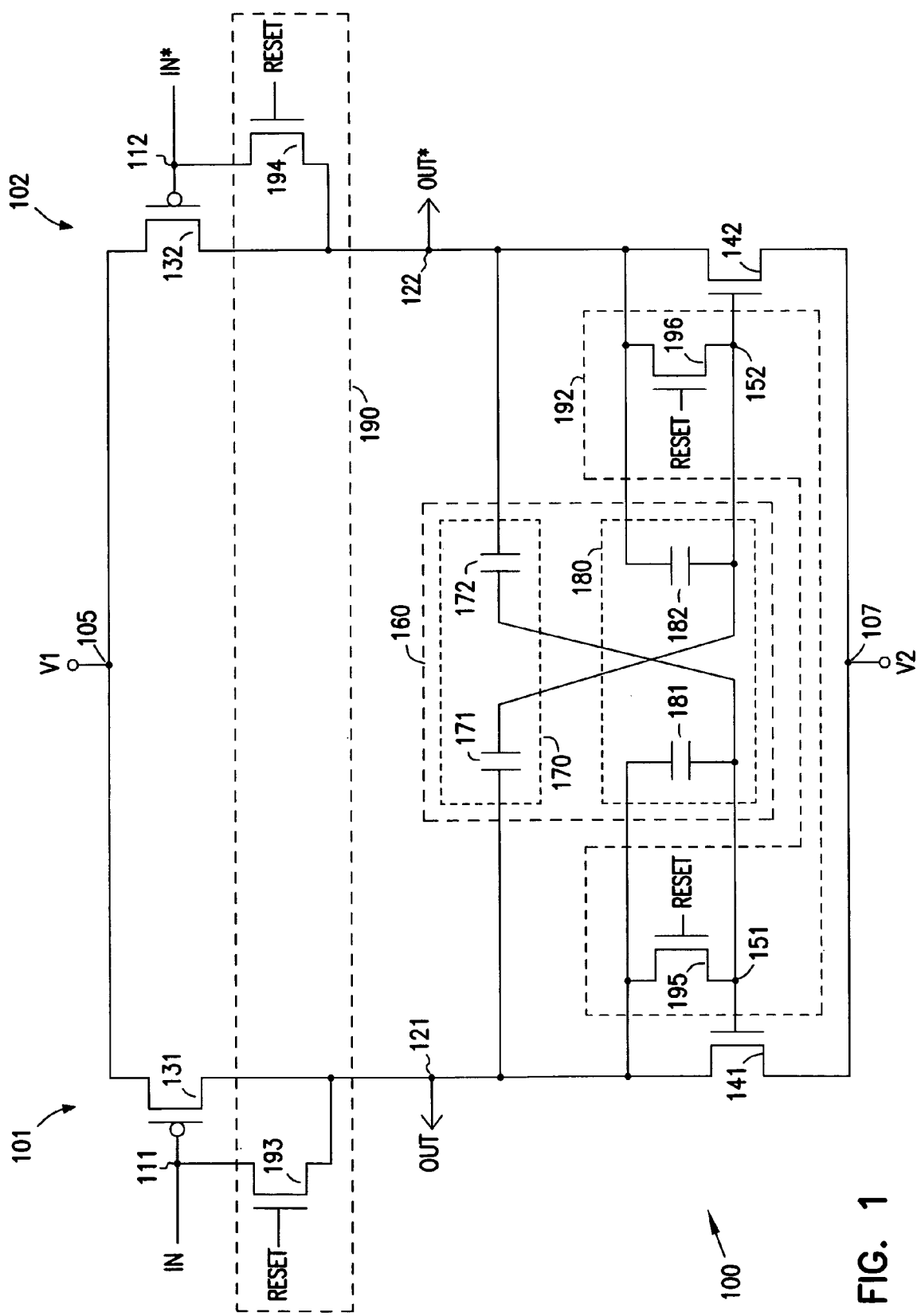
FIG. 1 shows an embodiment of a level restore circuit.

The following description and the drawings illustrate specific embodiments of the present disclosure sufficiently to enable those skilled in the art to practice them. Other embodiments may incorporate structural, logical, electrical, process, and other changes. In the drawings, like features or like numerals describe substantially similar components throughout the several views. Examples merely typify possible variations. Portions and features of some embodiments may be included in or substituted for those of others. References to "an", "one", or "various" embodiments in the present disclosure are not necessarily to the same embodiment, and such references contemplate more than one embodiment. The following detailed description is, therefore, not to be taken in a limiting sense, and the scope of the present disclosure is defined by the appended claims, along with the full scope of equivalents to which such claims are entitled.

FIG. 1 shows a level restore circuit. Level restore circuit 100 receives an input signal pair IN and IN* and produces an output signal pair OUT and OUT*. In some embodiments, the IN and IN* signal pair is a differential signal pair and the OUT and OUT* signal pair is a differential signal pair. The IN and IN* signals have a signal swing smaller than the signal swing of the OUT and OUT* signals. In some embodiments, the OUT and OUT* signals have a signal swing corresponding to logic levels such as logic one and logic zero.

In some embodiments, the IN and IN* signals represent complementary data or complementary logic values such as logic one and logic zero. However, the signal levels of the IN and IN* signals themselves may not be at appropriate signal levels to drive other circuits or to allow other circuits to correctly interpret the IN and IN* signals as representing the complementary logic values. Level restore circuit 100 restores the signal levels of the IN and IN* signals to appropriate restored signal levels so that the restored signal levels can correctly be interpreted as the complementary logic values. In level restore circuit 100, the OUT and OUT* signals represent the restored signal levels of the IN and IN* signals.

Level restore circuit 100 includes a first differential side 101 and a second differential side 102 coupled together by a capacitive network 160. Differential sides 101 and 102 couple in parallel between supply nodes 105 and 107. Supply node 105 receives a voltage V1. Supply node 107 receives a voltage V2. In some embodiments, V1 is a supply voltage of level restore circuit 100 and V2 is ground.

Differential side 101 has an input node 111 and output node 121. Differential side 102 has an input node 112 and output node 122. Input nodes 111 and 112 form an input node pair to receive the IN and IN* signals. Output nodes 121 and 122 form an output node pair to provide the OUT and OUT* signals. Differential sides 101 and 102 of level restore circuit 100 serve as differential sides of a differential amplifier or a sense amplifier.

Differential side 101 includes transistors 131 and 141 coupled in series between supply nodes 105 and 107. Transistors 131 and 141 have a common drain coupled to output node 121. Transistor 131 has gate coupled to input node 111 to receive the IN signal. Transistor 141 has gate coupled to a feedback node 151 to receive a feedback voltage from differential side 102.

Differential side 102 includes transistor 132 and 142 coupled in series between supply nodes 105 and 107. Transistors 132 and 142 have a common drain coupled to output node 122. Transistor 132 has gate coupled to input node 112 to receive the IN* signal. Transistor 142 has a gate coupled to a feedback node 152 to receive a feedback voltage from differential side 101.

In embodiments represented by FIG. 1, the transistors in each of the differential sides 101 and 102 are complementary metal-oxide semiconductor (CMOS) transistors. In some embodiments, the transistors in each of the differential sides 101 and 102 may be other types of transistors. In differential side 101, transistors 131 and 141 are a pair of CMOS transistors with transistor 131 being a p-channel transistor and transistor 141 being an n-channel transistor. In differential side 102, transistors 132 and 142 are a pair of CMOS transistors with transistor 132 being a p-channel transistor and transistor 142 being an n-channel transistor. CMOS transistors allow level restore circuit 100 to operate at a relatively high frequency and at a relatively low power. In some embodiments, the IN, IN*, OUT and OUT* signals have a frequency of seven gigahertz (7 GHz) and above.

Each of the transistors 131, 132, 141, and 142 has a threshold voltage. The threshold voltage of a transistor is the gate-to-source voltage at which the transistor starts to turn on (start to conduct). Transistor parameters such as channel length, channel width, gate oxide thickness, and doping concentration affect the value of the threshold voltage.

Transistors 131, 132, 141, and 142 are matched when the values of the transistor parameters among all of the transistors 131, 132, 141, and 142 are unvaried. In some embodiments, transistors 131, 132, 141, and 142 are matched when the threshold voltages among the transistors are unchanged.

Transistors 131, 132, 141, and 142 are mismatched when at least one of the transistors has a transistor parameter with a value different from the values of the transistor parameters of other transistors. In some embodiments, transistors 131, 132, 141, and 142 are mismatched such that the threshold voltage of one of the transistors is different from the threshold voltages of the other transistors.

Capacitive network 160 includes a coupling unit 170 and a stabilizing unit 180. Coupling unit 170 provides a positive feedback between the differential sides 101 and 102 to allow the OUT and OUT* signals to switch between different signal levels based on the IN and IN* signals. Stabilizing unit 180 improves stability of the OUT and OUT* signals when the OUT and OUT signals switch between the different signal levels.

Coupling unit 170 includes coupling capacitors 171 and 172. Coupling capacitor 171 couples between output node 121 of differential side 101 and feedback node 152 of differential side 102 to provide a positive feedback to differential side 102.

Coupling capacitor 172 couples between output node 122 of differential side 102 and feedback node 151 of differential side 101 to provide a positive feedback to differential side 101. The connections of coupling capacitors 171 and 172 between differential sides 101 and 102 are referred to as capacitively cross-coupled connections or capacitively-coupled positive feedback connections.

Stabilizing unit 180 includes stabilizing capacitors 181 and 182. Stabilizing capacitor 181 couples between output node 121 and feedback node 151. Stabilizing capacitor 182 couples between output node 122 and feedback node 152. Stabilizing capacitor 181 improves stability of the OUT signal when the OUT signal switches between different signal levels. Stabilizing capacitor 182 improves stability of the OUT* signal when the OUT* signal switches between different signal levels.

The capacitance values of coupling unit 170 and stabilizing unit 180 determine the gain of level restore circuit 100. In some embodiments, each of the coupling capacitors 171 and 172 has a first capacitance value and each of the stabilizing capacitors 181 and 182 has a second capacitance value. The ratio of the first capacitance value and the second capacitance value determines the gain of level restore circuit 100.

The capacitance value of each of the coupling capacitors 171 and 172 is greater than the capacitance value of each of the stabilizing capacitors 181 and 182. In some embodiments, the capacitance value of each of the coupling capacitors 171 and 172 is about 10 times the capacitance value of each of the stabilizing capacitors 181 and 182. For example, each of the coupling capacitors 171 and 172 may have a capacitance value of 100 femtofarads while each of the stabilizing capacitors 181 and 182 may have a capacitance value of 10 femtofarads.

Level restore circuit 100 further includes reset units 190 and 192. Reset units 190 and 192 together form a reset network to reset level restore circuit 100 in a reset mode. Reset units 190 and 192 respond to a reset signal RESET. When the RESET signal is activated, level restore circuit 100 is reset. When the RESET signal is deactivated, level restore circuit 100 is released from the reset. In some embodiments, the RESET signal is activated when it has high signal level and deactivated when it has a low signal level. In some embodiments, the RESET signal is a clock signal.

Reset unit 192 resets the charge (voltage) held in stabilizing capacitors 181 and 182 of both differential sides 101 and 102 to an initial value during the reset mode of level restore circuit 100. Reset unit 192 includes reset transistors 195 and 196. Both transistors 193 and 194 respond to the reset signal RESET. Transistor 195 responds to the RESET signal to reset the charge in stabilizing capacitor 181 to an initial value. Transistor 196 responds to the RESET signal to reset the charge in stabilizing capacitor 182 to the initial value. In some embodiments, the initial value is zero.

Reset unit 190 includes reset transistors 193 and 194. Transistor 193 responds to the RESET signal to reset input node 111 and output node 121 to a first reset voltage. Transistor 194 responds to the RESET signal to reset input node 112 and output node 122 to a second reset voltage. The first and second reset voltages are independent from each other.

In some embodiments, although the first and second reset voltages are independent from each other, each of the first and second reset voltages may be equal to an equalized voltage. For example, in embodiments where transistors 131, 132, 141, and 142 are matched, each of the first and second reset voltages may be equal to an equalized voltage of the average of V1 and V2.

In some embodiments, the first and second reset voltages are independent from each other and are also different voltages. For example, in embodiments where a mismatch exists among transistors 131, 132, 141, and 142, the first reset voltage may have a first value and second reset voltage may have a second value different from the first value.

Level restore circuit 100 restores the signal level of the IN and IN* signals to appropriate logic levels (represented by the OUT and OUT* signals) in both cases where transistors 131, 132, 141, and 142 are matched or mismatched.

In level store circuit 100, cross-coupling differential sides 101 and 102 with a capacitive network 160 reduces the effect of mismatches and offsets introduced by transistors 131, 132, 141, and 142. The reduction of the effect of mismatches and offsets allows level restore circuit 100 to be more reliable in producing the OUT and OUT* signals with correct logic levels based on the IN and IN* signals when the IN and IN* signal have a relatively low signal swing.

The operation of level restore circuit 100 is described in connection with FIG. 2.

Figure 2:
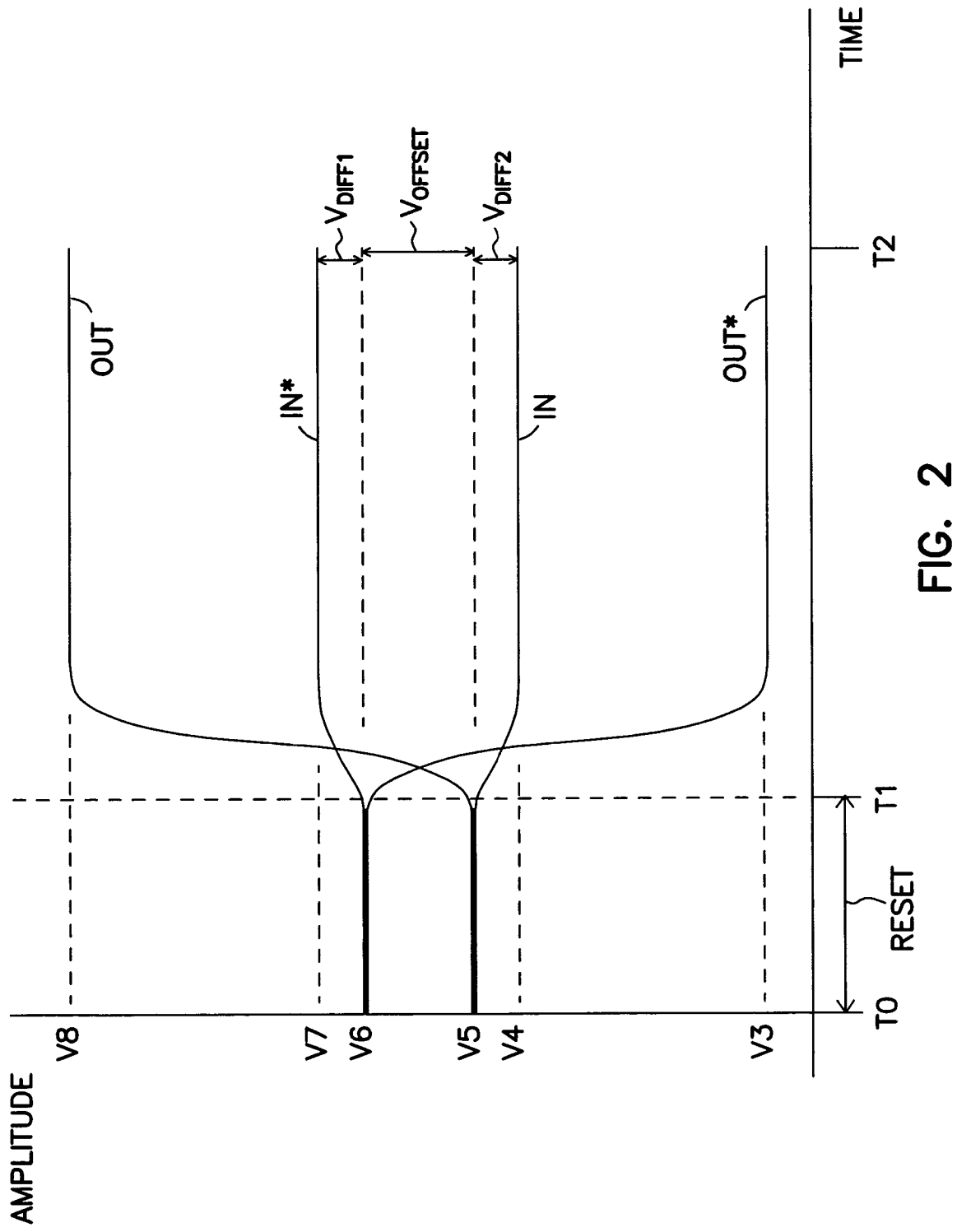
FIG. 2 shows an exemplary timing diagram for FIG. 1.

FIG. 2 shows an exemplary timing diagram for FIG. 1. In FIG. 2, V3 through V8 represent voltages of the IN, IN*, OUT, and OUT* signals at different times such as times T0, T1, and T2.

Between times T0 and T1, level restore circuit 100 of FIG. 1 is reset. As described in FIG. 1, when level restore circuit 100 is reset, both input node 111 output node 121 are reset to a first reset voltage, and both node 112 output node 122 are reset to a second reset voltage. In FIG. 2, V5 represents the first reset voltage and V6 represents the second reset voltage.

During the reset between times T0 and T1 in FIG. 2, transistors 193, 194, 195, and 196 turn on when the RESET signal is activated. Transistors 195 and 196 turn on to reset the potential across the plates of each of the stabilizing capacitors 181 and 182 to zero. Transistor 193 turns on to couple input node 111 and output node 121 together. Thus, the input node 111 and output node 121 are equalized to the first reset voltage. Transistor 194 turns on to couple input node 112 and output node 122 together. Thus, the input node 112 and output node 122 are equalized to a second reset voltage.

Transistors 193, 194, 195, and 196 turn off when the RESET signal is deactivated after time T1 in FIG. 2. When transistors 193, 194, 195, and 196 turn off, input node 111 and output node 121 are separated from each other, input node 112 and output node 122 are also separated from each other. Level restore circuit 100 senses the differential signal at input nodes 111 and 112 and switches the OUT and OUT* signals to appropriately signal levels.

As shown in FIG. 2, the first and second reset voltages have different values. V5 is less than V6. $V_{OFFSET}$ is the offset voltage or the difference between V6 and V5. In some embodiments, $V_{OFFSET}$ exists because a mismatch exits among the transistors 131, 132, 141, and 142 of FIG. 1. For example, the threshold voltage of the transistors 141 is lower than the threshold voltage of each of the other transistors 131, 141, and 142. When level restore circuit 100 is reset between times T0 and T1 in FIG. 2, the lower threshold voltage of transistor 141 of FIG. 1 causes an offset voltage developed ($V_{OFFSET}$ in FIG. 2) between input nodes 111 and 112 or between output nodes 121 and 122.

From time T1 to time T2 (after the reset) the IN signal goes down from V5 to V4 while the IN* signal goes up from V6 to V7. $V_{DIFF1}$ is the difference between V5 and V4. $V_{DIFF2}$ is the difference between V7 and V6. In some embodiments, $V_{DIFF1}$ and $V_{DIFF2}$ represent complementary data provided by a logic circuit.

In response to $V_{DIFF1}$ and $V_{DIFF2}$, level restore circuit 100 switches the OUT signal from V5 to V8 and switches the OUT* signal from V7 to V3. V8 and V3 of the OUT and OUT* signals correspond to logic one and logic zero of the complementary data represented by the IN and IN* signals. In some embodiments, V8 and V3 correspond to a rail-to-rail voltage such as Vcc and ground where Vcc is the supply voltage of level restore circuit 100.

In some embodiments, $V_{OFFSET}$ has a value of 200 mv (millivolt) while each of the $V_{DIFF1}$ and $V_{DIFF2}$ is about 50 mv (millivolt). The sum of $V_{DIFF1}$ and $V_{DIFF2}$ is the input differential voltage between the IN and IN* signal. Thus, in some embodiments, the input differential voltage ($V_{DIFF1}$+$V_{DIFF2}$) is less than the offset voltage $V_{OFFSET}$. In some embodiments, the differential voltage is about ten percent (10%) of Vcc and the offset voltage ($V_{OFFSET}$) is greater than 10% of Vcc, where Vcc is the supply voltage of level restore circuit 100.

In other level restore circuits where differential sides are coupled together by hard wires instead of by a capacitive network such as the capacitive network 160 of FIG. 1, the other level restore circuits may interpret the offset voltage as being a part of the input differential voltage of the IN and IN* signals when the input differential voltage is less than the offset voltage. Thus, incorrect restored signal levels at the output nodes of the other level restore circuits may occur when the differential signal is less than the offset voltage in other level restore circuits.

In level restore circuit 100, however, capacitors 171 and 172 absorb the offset voltage $V_{OFFSET}$ such that the OUT and OUT* signals still give correct logic levels when mismatches exist among the transistors of level restore circuit 100 and when the input differential voltage is less than the offset voltage. As shown in FIG. 2, the mismatches result in an offset voltage $V_{OFFSET}$ and the input differential voltage ($V_{DIFF1}$+$V_{DIFF2}$) is less than the offset voltage. However the OUT and OUT* signals still give correct logic levels at V8 and V3, which correspond to logic one and logic zero.

Figure 3:
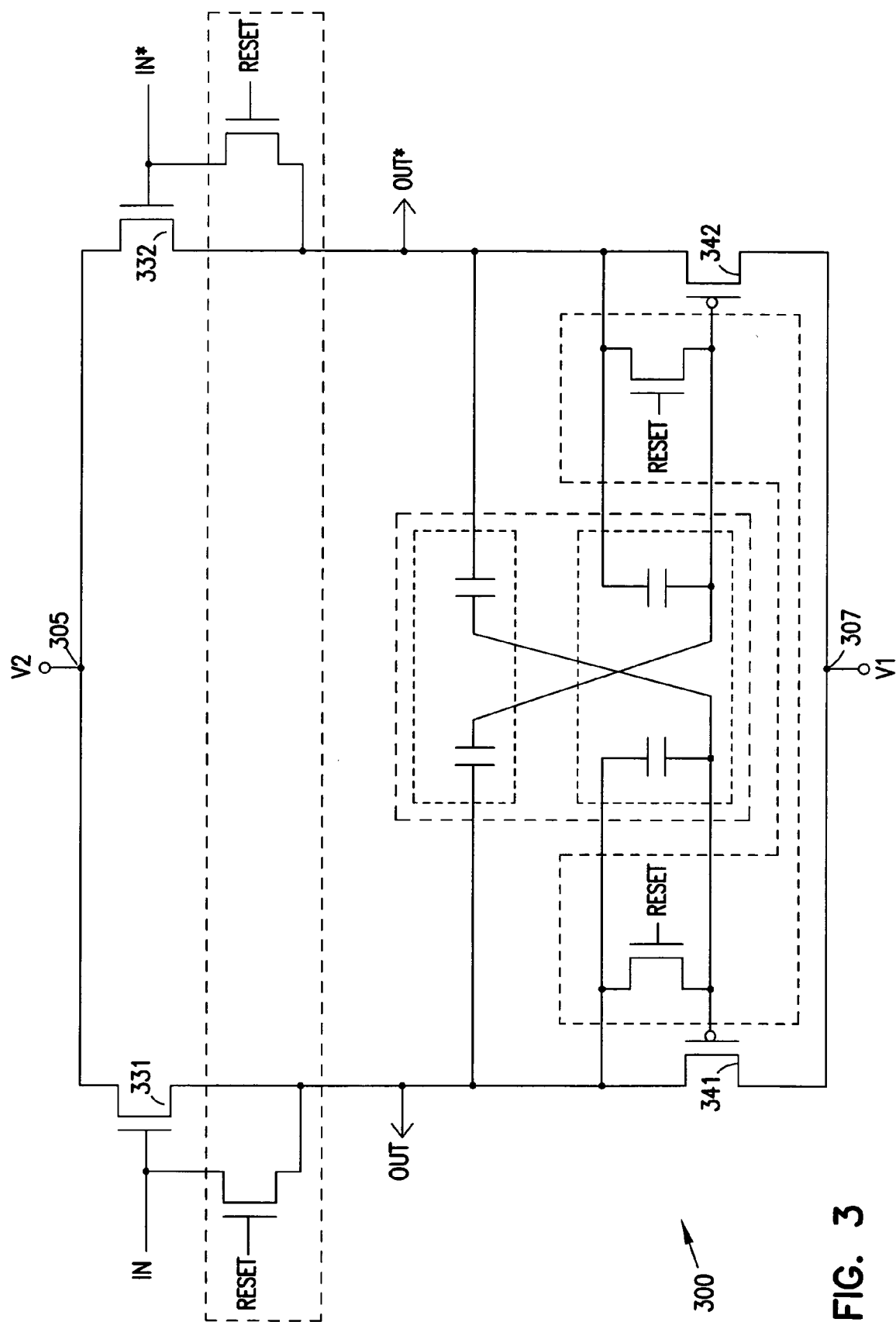
FIG. 3 shows a variation of the level restore circuit of FIG. 1.

FIG. 3 shows a variation of the level restore circuit of FIG. 1. In FIG. 3, level restore circuit 300 includes elements similar to the elements of level restore circuit 100 of FIG. 1. In FIG. 3, however, the p-channel and n-channel transistors swap locations and supply nodes 305 and 307 also swap locations in comparison with the level restore circuit 100 of FIG. 1. In FIG. 3, transistors 331 and 332 are n-channel transistors while transistors 341 and 342 are the p-channel transistors. Supply node 305 receives V2 while supply node 307 receives V1. As described in FIG. 1, in some embodiments, V1 is the supply voltage of level restore circuit 100 and V2 is ground. Similarly for FIG. 3, in some embodiments, V1 is the supply voltage of level restore circuit 300 and V2 is ground. Level restore circuit 300 operates in a fashion similar to that of level restore circuit 100 of FIG. 1.

Figure 4:
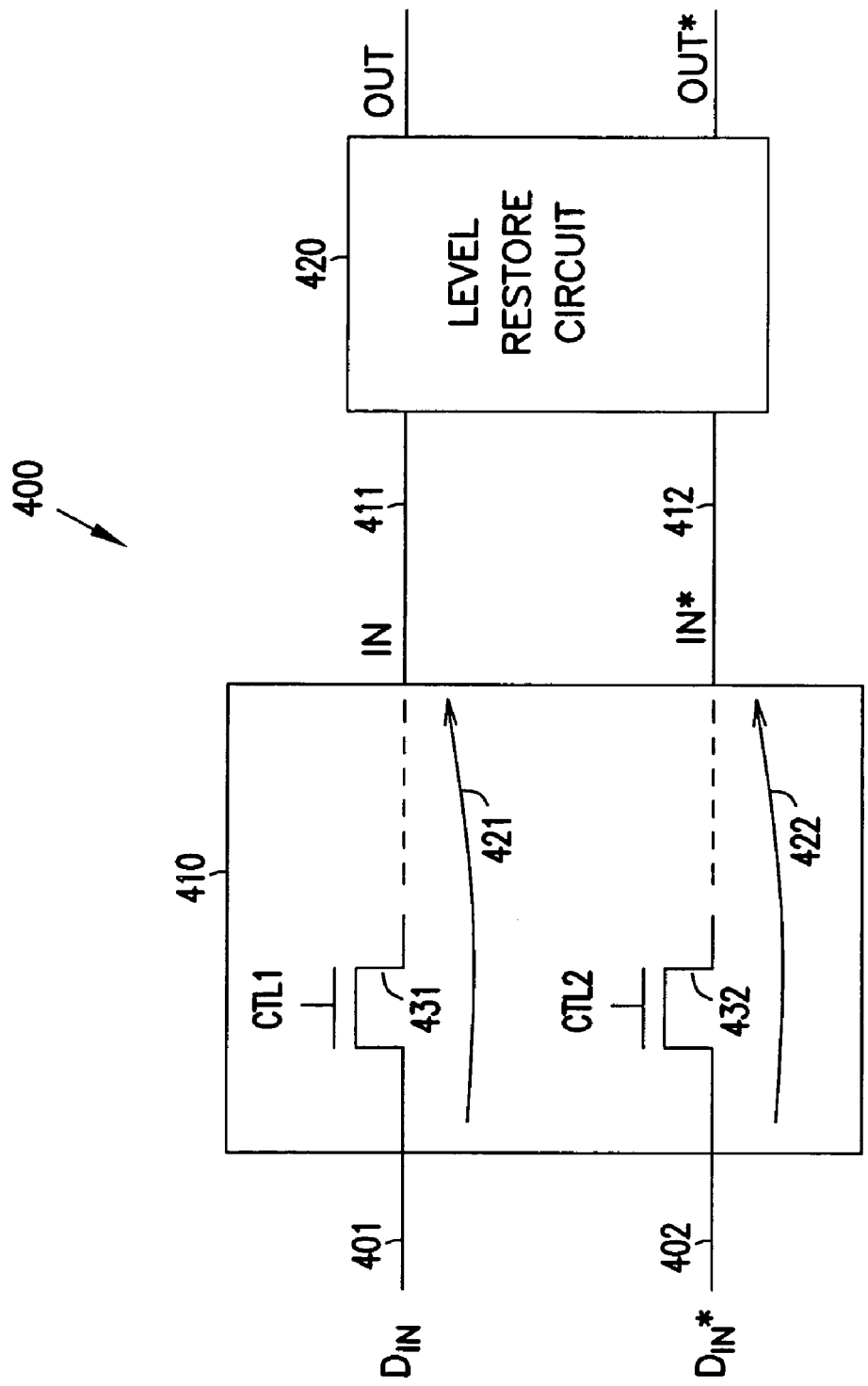
FIG. 4 shows an embodiment of device having a level restore circuit.

FIG. 4 shows an embodiment of a device having a level restore circuit. Device 400 may be a memory device, a processor, or other types of devices. For the purposes of illustrating embodiments of the present disclosure, FIG. 400 shows only a portion of device 400. Device 400 includes a circuit 410 and a level restore circuit 420.

In some embodiments, device 400 is a memory device and circuit 410 includes an address decoder to decode address locations of memory cells of the memory device. In other embodiments, circuit 410 includes logic circuit for performing logic functions. Examples of logic functions include logic functions OR, NOR, AND, NAND, exclusive OR, and other logic functions. In some other embodiments, circuit 410 includes an adder circuit.

Circuit 410 receives a pair of complementary data signal $D_{IN}$ and $D_{IN}*$ at input nodes 501 and 502 and generates complementary input or sense signal pair IN and IN*. The IN and IN* signals feed input nodes 411 and 412 of level restore circuit 420.

Circuit 410 includes a data path 421 coupled between nodes 401 and 411, and a data path 422 coupled between nodes 402 and 412. Data path 401 includes at least one transistor 431 coupled in series between input nodes 401 and 411 to propagate the IN signal to node 411 in response to a control signal CTL1. Data path 402 includes at least one transistor 432 coupled in series between input nodes 402 and 412 to pass the IN* signal to node 412 response to a control signal CTL2.

In some embodiments, circuit 410 includes a pass transistor logic circuit for performing logic functions such that the IN and IN* represent the results of the logic functions performed to the $D_{IN}$ and $D_{IN}*$ signals. In some embodiments, the IN and IN* signals have a signal swing smaller than the signal swing of the $D_{IN}$ and $D_{IN}*$ signals.

Level restore circuit 400 receives the IN and IN* signals and generates output signals OUT and OUT*. Level restore circuit 400 restores the signal levels of the IN and IN* signals such that the signal swing of the OUT and OUT* signals is greater than the signal swing of the IN and IN* signal to appropriately represent the full logic levels of logic one and logic zero.

Level restore circuit 420 includes embodiments of level restore circuit 100 of FIG. 1 and level restore circuit 300 of FIG. 3.

Figure 5:
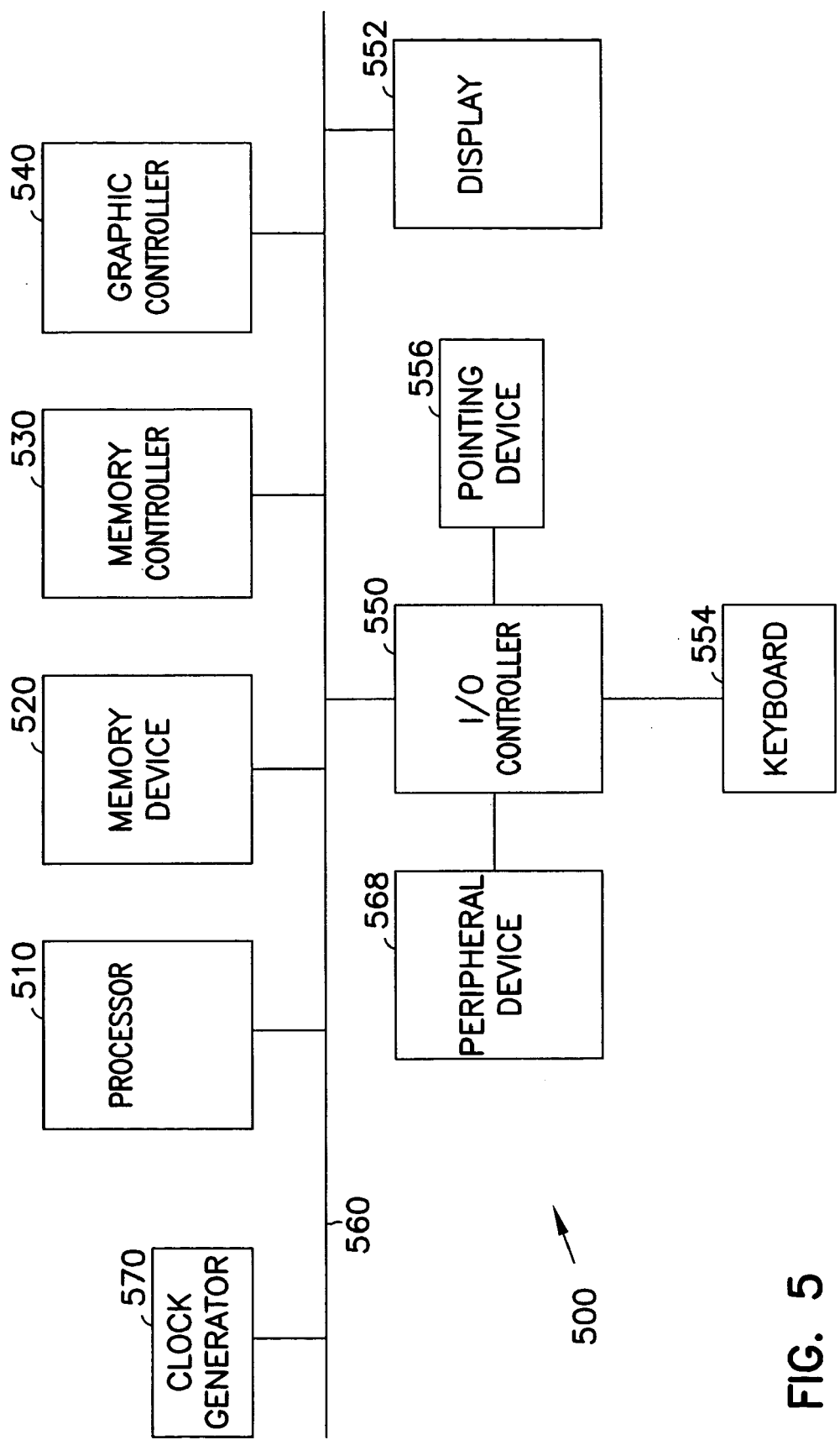
FIG. 5 shows an embodiment of a system.

FIG. 5 shows an embodiment of a system. System 500 includes at least one processing unit or processor 510, memory device 520, memory controller 530, graphic controller 540, input and output (I/O) controller 550, display 552, keyboard 554, pointing device 556, and peripheral device 558. Bus 560 connects all of these devices together. Clock circuit 570 provides a clock signal to at least one of the devices of system 500. In some embodiments, system 500 may omit one or more devices shown in FIG. 5. In some embodiments, two or more devices shown in system 500 may be formed on a single chip.

Bus 560 may be conducting traces on a circuit board or may be one or more cables. Bus 560 may also connect the devices of system 500 by wireless means such as electromagnetic radiation (e.g., radio waves). Bus 560 may further include at least one optical link connection to at least one of the devices shown in FIG. 5 to provide a signal to an optical link transceiver of at least one of the devices through the optical link. Peripheral device 558 may be a printer, an optical device (e.g., a compact disc read only memory (CD-ROM) device or a digital video disc (DVD) device), a magnetic device (e.g., floppy disk driver), or an audio device (e.g., a microphone). Memory device 520 may comprise a dynamic random access memory (DRAM) device, a static random access memory (SRAM) device, a flash memory device, or a combination thereof.

At least one of the devices shown in system 500 includes embodiments of FIG. 1 through FIG. 4. Thus, at least one of the devices shown in system 500 includes embodiments of either a level restore circuit such as level restore circuits 100 and 300 or a combination of a logic circuit and a level restore circuit such as logic circuit 410 and level restore circuit 420.

System 500 may take the form of computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Various embodiments of the present disclosure provides circuits and methods for reducing the effect of mismatches in transistors and offsets in reset voltages of level restore circuits so that the level restore circuits are more reliable in producing output signals with correct logic levels based on input signals with a relatively low signal swing.

Although specific embodiments have been illustrated and described herein, it should be appreciated that any arrangement calculated to achieve the same purpose may be substituted for the specific embodiments shown. The present disclosure is intended to cover any and all adaptations or variations of various embodiments. Combinations of the above embodiments, and other embodiments not specifically described herein, will be apparent to those of skill in the art upon reviewing the above description.

What is claimed is:

1. A circuit comprising:
   a first differential side and a second differential side for generating a differential output signal pair based on a differential input signal pair;
   a capacitive network for capacitively coupling the first differential side to the second differential side to provide a capacitively-coupled positive feedback between the first and second differential sides;
   a reset network for resetting the first and second differential sides to reset voltages independent from each other; and
   wherein the capacitive network includes a first node coupled to an output node of the first differential side, a second node coupled to an output node of the second differential side, a third node coupled to a first node of the reset network, and a fourth node coupled to a first node of the reset network.

2. The circuit of claim 1, wherein the capacitive network includes:
   a coupling unit for capacitively coupling the output node of the first differential side to a feedback node of the second differential side, and for capacitively coupling the output node of the second differential side to a feedback node of the first differential side; and
   a stabilizing unit for capacitively coupling the output node of the first differential side to the feedback node of the first differential side and for capacitively coupling the output node of the second differential side to the feedback node of the second differential side.

3. The circuit of claim 1, wherein each the first and second differential sides includes a differential input node for receiving one signal of the differential input signal pair, and a differential output node for providing one signal of the differential output signal pair.

4. The circuit of claim 3, wherein the reset network is configured to reset the differential input node of the first differential side to a first voltage and to reset the differential input node of the second differential side to a second voltage independent from the first voltage.

5. The circuit of claim 4, wherein the reset network is configured to reset the differential output node of the first differential side to the first voltage and to reset the differential output node of the second differential side to the second voltage.

6. A circuit comprising:
a first differential side and a second differential side for generating a differential output signal pair based on a differential input signal pair;
a capacitive network for capacitively coupling the first differential side to the second differential side to provide a capacitively-coupled positive feedback between the first and second differential sides; and
a reset network for resetting the first and second differential sides to reset voltages independent from each other, wherein the capacitive network includes a coupling unit for capacitively coupling an output node of the first differential side to a feedback node of the second differential side, and for capacitively coupling an output node of the second differential side to a feedback node of the first differential side, and a stabilizing unit for capacitively coupling the output node of the first differential side to the feedback node of the first differential side and for capacitively coupling the output node of the second differential side to the feedback node of the second differential side, wherein the first differential side includes a pair of transistors coupled in series between a first supply node and a second supply node, the pair of transistors having a common drain coupled to the output node of the first differential side, a first gate coupled to an input node of the first differential side, and a second gate coupled to the feedback node of the second differential sides, and wherein the second differential side includes a pair of transistors coupled in series between the first and second supply nodes, the pair of transistors having a common drain coupled to the output node of the second differential side, a first gate coupled to an input node of the second differential side, and a second gate coupled to the feedback node of the first differential side.

7. A circuit comprising:
a first transistor pair and a second transistor pair coupled in parallel between a first supply node and a second supply node, each of the first and second transistor pairs including first and second transistors coupled series between the first and second supply nodes and further including a common drain, a first gate, and second gate;
a first coupling capacitor coupled between the common drain of the first transistor pair and the first gate of the second transistor pair;
a second coupling capacitor coupled between the common drain of the second transistor pair and the first gate of the first transistor pair;

a first stabilizing capacitor coupled between the common drain of the first transistor pair and the first gate of the first transistor pair;
a second stabilizing capacitor coupled between the common drain of the second transistor pair and the first gate of the second transistor pair; and
a reset network for resetting the first gate and the common drain of the first transistor pair to a first reset voltage and for resetting the first gate and the common drain of the second transistor pair to a second reset voltage independent from the first reset voltage.

8. The circuit of claim 7, wherein the reset network includes:
a first reset transistor coupled between the common drain of the first transistor pair and the first gate of the first transistor pair;
a second reset transistor coupled between the common drain of the second transistor pair and the first gate of the second transistor pair; and
a reset unit for resetting a potential across each of the first and second stabilizing capacitors to an initial value.

9. The circuit of claim 8, wherein the reset unit includes:
a first transistor coupled between the common drain of the first transistor pair and the first gate of the first transistor pair; and
a second transistor coupled between the common drain of the second transistor pair and the first gate of the second transistor pair.

10. The circuit of claim 7, wherein each of the first and second coupling capacitors has capacitance greater than a capacitance of each of the first and second stabilizing capacitors.

11. The circuit of claim 7, wherein each of the first and second coupling capacitors has capacitance about ten times greater than a capacitance of each of the first and second stabilizing capacitors.

12. The circuit of claim 7, wherein the first and second transistors of each of the first and second transistor pairs are complementary metal-oxide semiconductor (CMOS) transistors.

13. A device comprising:
a first circuit for receiving an input signal pair with a first signal swing to produce a sense signal pair with a second signal swing; and
a level restore circuit including a first differential side and a second differential side for producing an output signal pair based on the sense signal pair, a capacitive network for capacitively coupling the first differential side to the second differential side to provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the capacitive network includes a first node coupled to the output node of the first differential side, a second node coupled to the output node of the second differential side, a third node coupled to a first node of the reset network, and a fourth node coupled to a first node of the reset network.

14. The device of claim 13, wherein the capacitive network and the reset network are configured to store charge at input nodes and the output nodes of the first and second differential sides to compensate for transistor mismatches in the first and second differential sides.

15. The device of claim 13, wherein the input node of each of the first and second differential sides is configured to receive one signal of the sense signal pair, and wherein the output node of each of the first and second differential sides is configured to provide one signal of the output signal pair.

16. The device of claim 15, wherein the capacitive network includes:
   a coupling unit for capacitively coupling the output node of the first differential side to a feedback node of the second differential side and for capacitively coupling the output node of the second differential side to a feedback node of the first differential side; and
   a stabilizing unit for capacitively coupling the output node of the first differential side to the feedback node of the first differential side and for capacitively coupling the output node of the second differential side to the feedback node of the second differential side.

17. The device of claim 13, wherein the first circuit includes a logic circuit.

18. A device comprising:
   a first circuit for receiving an input signal pair with a first signal swing to produce a sense signal pair with a second signal swing; and
   a level restore circuit including a first differential side and a second differential side for producing an output signal pair based on the sense signal pair, a capacitive network for capacitively coupling the first differential side to the second differential side to provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the capacitive network and the reset network are configured to store charge at input nodes and output nodes of the first and second differential sides to compensate for transistor mismatches in the first and second differential sides, wherein the capacitive network includes a coupling unit for capacitively coupling the output node of the first differential side to a feedback node of the second differential side and for capacitively coupling the output node of the second differential side to a feedback node of the first differential side, and a stabilizing unit for capacitively coupling the output node of the first differential side to the feedback node of the first differential side and for capacitively coupling the output node of the second differential side to the feedback node of the second differential side, and wherein the reset network further includes a reset unit for resetting a charge value of the stabilizing unit to an initial value.

19. A device comprising:
   a first circuit for receiving an input signal pair with a first signal swing to produce a sense signal pair with a second signal swing; and
   a level restore circuit including a first differential side and a second differential side for producing an output signal pair based on the sense signal pair, a capacitive network for capacitively coupling the first differential side to the second differential side to provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the first circuit includes an address decoder.

20. A device comprising:
   a first circuit for receiving an input signal pair with a first signal swing to produce a sense signal pair with a second signal swing; and
   a level restore circuit including a first differential side and a second differential side for producing an output signal pair based on the sense signal pair, a capacitive network for capacitively coupling the first differential side to the second differential side to provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the first circuit is configured to produce the sense signal pair with the second signal swing smaller than the first signal swing.

21. The device of claim 20, wherein the level restore circuit is configured to produce the output signal pair with a signal swing greater than the second swing.

22. The device of claim 21, wherein the level restore circuit is configured to produce the output signal pair to represent a logic one and a logic zero.

23. A device comprising:
   a first circuit for receiving an input signal pair with a first signal swing to produce a sense signal pair with a second signal swing; and
   a level restore circuit including a first differential side and a second differential side for producing an output signal pair based on the sense signal pair, a capacitive network for capacitively coupling the first differential side to the second differential side to provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the first circuit includes a pair of transistors coupled between the first circuit and the level restore circuit for passing the sense signal pair from the first circuit to the level restore circuit in response to a control signal.

24. A system comprising:
   a processor; and
   a memory device coupled to the processor, at least one of the processor and the memory device including:
   a pass transistor logic circuit for generating a differential input signal pair; and
   a sense amplifier including a first differential side and a second differential side for producing a differential output signal pair based on the differential input signal pair, a capacitive network for capacitively coupling the first differential side to the second differential side provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage.

25. The system of claim 24, wherein the capacitive network includes:

a coupling unit for capacitively coupling an output node of the first differential side to a feedback node of the second differential side and for capacitively coupling an output node of the second differential side to a feedback node of the first differential side; and a stabilizing unit for capacitively coupling the output node of the first differential side to the feedback node of the first differential side and capacitively coupling the output node of the second differential side to the feedback node of the second differential side.

26. The system of claim 25, wherein the coupling unit and the stabilizing unit are configured to provide a gain for the sense amplifier based on a capacitance value of the coupling unit and a capacitance value of the stabilizing unit.

27. The system of claim 24, wherein the reset network is configured to reset first input and output nodes of the sense amplifier to a first voltage, and to reset second input and output nodes of the sense amplifier to a second voltage independent from the second voltage.

28. The system claim 24, wherein the pass transistor logic circuit includes:
a first transistor responsive to a control signal to pass a first signal of the differential input signal pair to the sense amplifier; and
a second transistor responsive to the control signal to pass a second signal of the differential input signal pair to the sense amplifier.

29. A method comprising:
performing a reset to reset a first differential input node and a first differential output node of a first differential side to a first reset voltage and to reset a second differential input node and a differential output of a second differential side to a second reset voltage independent from the first reset voltage, wherein the first and second differential sides are capacitively-coupled to store an offset voltage generated during the reset; and
generating a differential output signal pair at the first and second differential output nodes based on a differential input signal pair received at the first and second differential input nodes after the reset.

30. The method of claim 29, wherein the first and second differential sides are capacitively coupled by a pair of capacitors cross-coupled between the output nodes of the first and second differential sides and feedback nodes of the first and second differential sides.

31. The method of claim 29, wherein the offset voltage is the difference between the first and second reset voltage.

32. The method of claim 29, wherein the differential input signal pair has a differential voltage, wherein the differential voltage is less than a difference between the first reset voltage and the reset second voltage.

33. The method of claim 29 further comprising:
passing the differential input signal pair to the first and second differential input nodes from a logic circuit.

34. The method of claim 33, wherein the logic circuit includes a pass transistor logic circuit.

35. A method comprising:
receiving an input signal pair with a first signal swing to produce a sense signal pair with a second signal swing;
passing the sense signal pair to a level restore circuit; and
producing at the level restore circuit an output signal pair based on the sense signal pair, wherein the level restore circuit includes a first differential side and a second differential side for producing an output signal pair based on the sense signal pair, a capacitive network for capacitively coupling the first differential side to the second differential side provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the capacitive network includes a first node coupled to the output node of the first differential side, a second node coupled to the output node of the second differential side, a third node coupled to a first node of the reset network, and a fourth node coupled to a first node of the reset network.

36. A method comprising:
receiving an input signal pair with a first signal swing to produce a sense signal pair with a second signal swing;
passing the sense signal pair to a level restore circuit; and
producing at the level restore circuit an output signal pair based on the sense signal pair, wherein the level restore circuit includes a first differential side and a second differential side for producing an output signal pair based on the sense signal pair, a capacitive network for capacitively coupling the first differential side to the second differential side provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the sense signal pair is generated by a pass transistor logic circuit.

37. A method comprising:
receiving an input signal pair with a first signal swing to produce a sense signal pair with a second signal swing;
passing the sense signal pair to a level restore circuit; and
producing at the level restore circuit an output signal pair based on the sense signal pair, wherein the level restore circuit includes a first differential side and a second differential side for producing an output signal pair based on the sense signal pair, a capacitive network for capacitively coupling the first differential side to the second differential side provide a capacitively-coupled positive feedback between the first and second differential sides, and a reset network for resetting an input node and an output node of the first differential side to a first reset voltage and for resetting an input node and an output node of the second differential side to a second reset voltage independent from the first reset voltage, wherein the first signal swing is greater than the second signal swing.

38. The method of claim 37, wherein the output signal pair has a signal swing greater than the second signal swing.

39. The method of claim 38, wherein output signal pair represents a logic one and a logic zero.

40. A method comprising:
forming a first differential side and a second differential side for generating a differential output signal pair based on a differential input signal pair;
forming a capacitive network for capacitively coupling the first differential side to the second differential side to provide a capacitively-coupled positive feedback between the first and second differential sides; and
forming a reset network for resetting the first and second differential sides to reset voltages independent from each other, wherein forming the capacitive network includes forming a first node of the capacitive network coupled to an output node of the first differential side, forming a second node of the capacitive network coupled to an output node of the second differential side, forming a third node of the capacitive network coupled to a first node of the reset network, and forming a fourth node of the capacitive network coupled to a first node of the reset network.

41. The method of claim 40, wherein forming the capacitive network includes:
capacitively coupling an output node of the first differential side to a feedback node of the second differential side;
capacitively coupling an output node of the second differential side to a feedback node of the first differential side;
capacitively coupling the output node of the first differential side to the feedback node of the first differential side; and
capacitively coupling the output node of the second differential side to the feedback node of the second differential side.

42. A method comprising:
forming a first differential side and a second differential side for generating a differential output signal pair based on a differential input signal pair;
forming a capacitive network for capacitively coupling the first differential side to the second differential side to provide a capacitively-coupled positive feedback between the first and second differential sides; and
forming a reset network for resetting the first and second differential sides to reset voltages independent from each other, wherein forming the capacitive network includes:
capacitively coupling an output node of the first differential side to a feedback node of the second differential side;
capacitively coupling an output node of the second differential side to a feedback node of the first differential side;
capacitively coupling the output node of the first differential side to the feedback node of the first differential side; and
capacitively coupling the output node of the second differential side to the feedback node of the second differential side, and wherein forming the first differential side includes forming a pair of transistors coupled in series between a first supply node and a second supply node, the pair of transistors having a common drain coupled to the output node of the first differential side, a first gate coupled to an input node of the first differential side, and a second gate coupled to the feedback node of the second differential sides, and wherein forming the second differential side includes forming a pair of transistors coupled in series between the first and second supply nodes, the pair of transistors having a common drain coupled to the output node of the second differential side, a first gate coupled to an input node of the second differential side, and a second gate coupled to the feedback node of the first differential sides.

43. The method of claim 42, wherein forming the reset network includes:
forming a first transistor coupled between the common drain of the first transistor pair and the first gate of the first transistor pair;
forming a second transistor coupled between the common drain of the second transistor pair and the first gate of the second transistor pair;
forming a third transistor coupled between the common drain of the first transistor pair and the first gate of the first transistor pair; and
forming a fourth transistor coupled between the common drain of the second transistor pair.

* * * * *

UNITED STATES PATENT AND TRADEMARK OFFICE
CERTIFICATE OF CORRECTION

PATENT NO. : 7,176,719 B2 Page 1 of 1
APPLICATION NO. : 10/931379
DATED : February 13, 2007
INVENTOR(S) : Forbes It is certified that error appears in the above-identified patent and that said Letters Patent is hereby corrected as shown below:

Title page, Item (56), under "Other Publications", in column 2, line 2, delete "MIcroelectronics" and insert -- Microelectronics --, therefor.

In column 13, line 29, in Claim 29, delete "perfonning" and insert -- performing --, therefor.

In column 16, line 36, in Claim 43, after "transistor pair" insert -- and the first gate of the second transistor pair --.

Signed and Sealed this

Eighteenth Day of September, 2007

JON W. DUDAS
*Director of the United States Patent and Trademark Office*